United States Patent [19]
Farquhar et al.

[11] Patent Number: 5,993,579
[45] Date of Patent: Nov. 30, 1999

[54] HIGH PERFORMANCE ELECTRICAL CABLE AND METHOD OF MANUFACTURE

[75] Inventors: Donald Seton Farquhar, Endicott; William Louis Brodsky, Binghamton; Natalie Barbara Feilchenfeld, Endicott; Lisa Jeanine Jimarez, Newark Valley; James Robert Wilcox, Vestal, all of N.Y.

[73] Assignee: International Business Machines Corporation, Armonk, N.Y.

[21] Appl. No.: 08/876,502

[22] Filed: Jun. 16, 1997

Related U.S. Application Data

[62] Division of application No. 08/626,732, Apr. 1, 1996, Pat. No. 5,847,324.

[51] Int. Cl.$^6$ .................................................... H01B 13/00
[52] U.S. Cl. ............................ 156/47; 29/829; 156/48; 156/52; 156/280; 156/313
[58] Field of Search .................................. 156/52, 47, 48, 156/313, 280; 29/829; 174/117 FF

[56] References Cited

U.S. PATENT DOCUMENTS

| | | | |
|---|---|---|---|
| 3,757,029 | 9/1973 | Marshall | 174/117 FF |
| 4,685,033 | 8/1987 | Inoue | 29/829 |
| 5,592,737 | 1/1997 | Middelman et al. | 156/3.3 |

FOREIGN PATENT DOCUMENTS

| | | | |
|---|---|---|---|
| 3-50893 | 3/1991 | Japan | 29/829 |

*Primary Examiner*—John J. Gallagher
*Attorney, Agent, or Firm*—Schmeiser, Olsen & Watts; Lawrence R. Fraley

[57] ABSTRACT

A composite cable has a reinforcing layer with conductors disposed on opposed planar surfaces. Dielectric film layers electrically separate the conductors on the planar reinforcing layer from respective layers of additional conductors. The flexible cable is manufactured by laminating a layer of dielectric film and a layer of electrically conductive material onto both sides of a double clad core which provides a strain relief reinforcement for the cable.

6 Claims, 2 Drawing Sheets

HIGH PERFORMANCE ELECTRICAL CABLE AND METHOD OF MANUFACTURE

This application is a division of application Ser. No. 08/626,732, filed Apr. 1, 1996, now U.S. Pat. No. 5,847,324.

BACKGROUND OF THE INVENTION

1. Technical Field

This invention relates generally to high performance flexible electrical cables and their manufacture, and more particularly to a flat cable having a high strength core element.

2. Background Art

High performance flexible electrical cables suitable for use in computer and similar high density cabling systems have heretofore been prone to the development of short circuits between the signal and the reference, or ground, planes. In an attempt to avoid this problem, many cables of this type arrange signal and ground conductors in coplanar, or side-by-side, relationship. For example, U.S. Pat. No. 4,783,293 issued May 31, 1988 to Kikuchi et al describes a flexible cable construction in which signal conductors are planarly arranged with reference, or ground, conductors which are in an exposed position after fabrication of the cable. U.S. Pat. No. 4,798,918 issued Jan. 17, 1989 to Kabadi et al describes an adhesively laminated structure having two parallel coplanar arrays consisting of adjacently positioned signal and ground conductors within each plane. When reference, or ground, conductors are arranged in side-by-side relationship with signal conductors, it decreases the number of signal conductors that can be carried within a fixed cable width at a required pitch, or lateral spacing. For example, only one-third of the conductors in the Kabadi et al arrangement can be used as signal conductors. Also, the Kabadi et al arrangement requires the use of a thin adhesive layer to bond adjacent layers of the cable. The use of adhesive materials in high performance flexible cable construction is generally undesirable because of the extra fabrication steps required to coat a substrate and cure the adhesive material. Also, adhesives generally cannot be used in the fabrication of cable assemblies that may be subsequently subjected to high temperature processing that may be required for high performance dielectric materials.

The present invention is directed to overcoming the problems set forth above. It is desirable to have a high performance flexible cable in which a plurality of signal conductors may be arranged in a plane at a fine pitch spacing without the requirement for ground conductors between adjacent conductors. It is also desirable to have such a flexible cable in which each of the planarly disposed signal conductors are in close proximity to a ground plane. It is also desirable to have such a flexible cable in which signal conductors may be disposed in two parallel planes with a ground plane positioned between the two parallel planes of signal conductors. Further, it is desirable to have such a flexible cable which has a core member which has high mechanical strength to provide improved mechanical integrity to the cable. Still further, it is desirable to have such a flexible cable construction, and a method of manufacturing such a cable, that does not use adhesive materials to bond adjacently disposed layers of conductors and dielectric material.

SUMMARY OF THE INVENTION

In one aspect of the present invention, a flexible cable for conducting electrical signals has a planar core that is formed of a dielectric material and has upper and lower planar surfaces. A layer of a first electrically conductive metallic material is disposed on each of the upper and lower planar surfaces of the core member in contiguous relationship with the respective planar surface. A layer of dielectric film is respectively superimposed on each of the layers of the first conductive material and a layer of a second electrically conductive metallic material is respectively disposed on each of the layers of dielectric film. Each of the layers of dielectric film and each of the layers of the second electrically conductive metallic material are disposed in contiguous relationship with the respective adjacent layers.

Other features of the flexible cable embodying the present invention include the planar core member being formed of polyimide film, the first and second electrically conductive metallic materials being copper, and the dielectric film being formed of a selected fluoropolymer or copolymer of polytetrafluoroethylene.

In another aspect of the present invention, a method of manufacturing a flexible cable includes providing a core structure comprising a planar dielectric member having a layer of an electrically conductive material clad on each of a pair of opposed planar surfaces. A layer of dielectric film is arranged on each layer of the electrically conductive material of the core structure. A layer of a second electrically conductive material is arranged on each layer of the dielectric film. The layers of the second electrically conductive material, the layers of dielectric material and the core structure are then laminated together to form a laminated structure comprising the core structure, the layers of dielectric film and the layers of the second electrically conductive material.

Other features of the method of manufacturing the flexible cable include forming each of the layers of the second electrically conductive material into a plurality of spaced apart discrete electrical conductor leads, either before arrangement on the dielectric film or after lamination, and forming an electrical connection between the layers of the electrically conductive material disposed on the opposed planar surfaces of the planar dielectric member. Another feature of the method of manufacturing the flexible cable includes applying an electrical insulation covering over the laminated structure.

DETAILED DESCRIPTION OF A PRESENTLY PREFERRED EXEMPLARY EMBODIMENT

Figure 1:
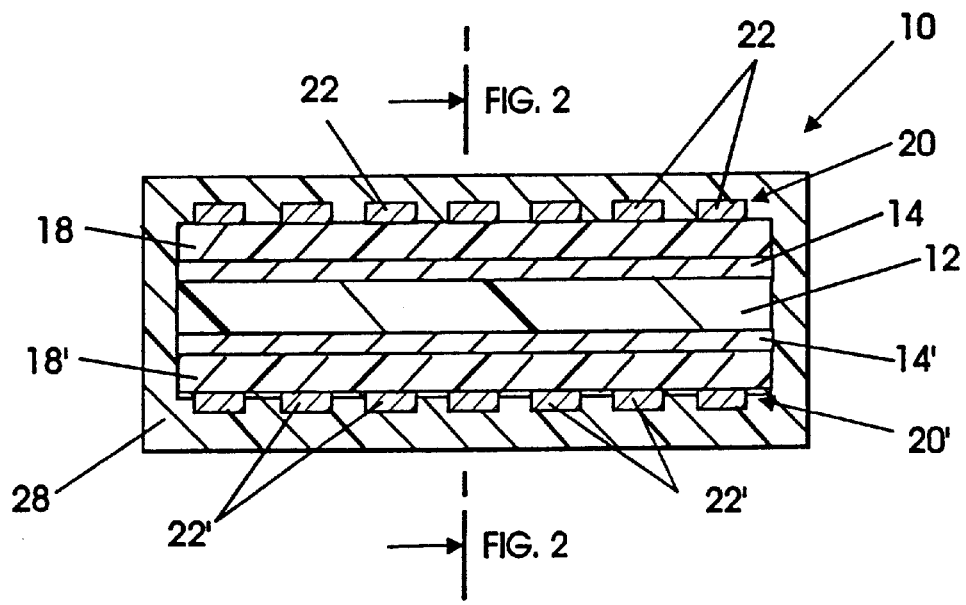
FIG. 1 is a transverse sectional view of the flexible cable embodying the present invention.
Figure 2:
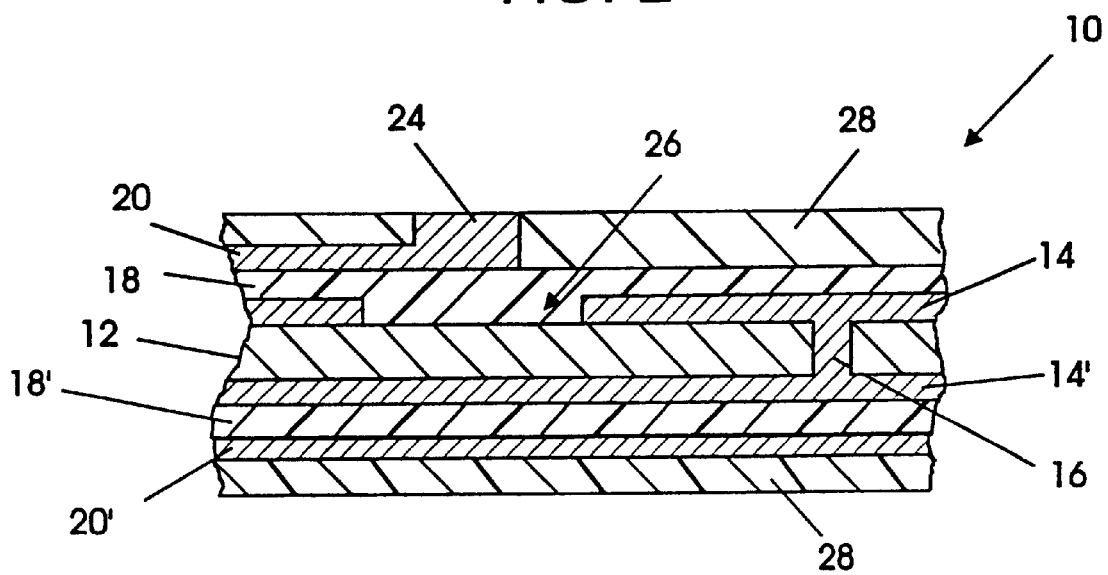
FIG. 2 is a longitudinal sectional view of the flexible cable embodying the present invention, taken along the line 2—2 of FIG. 1.

A high performance flexible cable embodying the present invention is generally indicated by the reference number 10 in the transverse and longitudinal sectional views shown respectively in FIGS. 1 and 2. The flexible cable 10 has a flat ribbon-type construction and, in the exemplary embodiment, has a conductor arrangement generally referred to as 2S1P, meaning the cable contains signal conductors disposed in two planes and a power, or ground, conductor disposed in one plane. Typically the flexible cable 10 will have a width of from about 0.5 in (1.3 cm) to about 2 in (5.1 cm), although other widths may be formed for particular application requirements in accordance with the below described method of manufacturing the flexible cable 10. Also typically, the flexible cable 10, when constructed in accordance with the below described exemplary embodiment, has a thickness of from about 5.8 mils (150 μm) to about 9.8 mils (250 μm), exclusive of the outer insulation cover.

In the preferred exemplary embodiment of the present invention, the flexible cable 10 has a centrally disposed planar core member 12 that is preferably a polyimide film having a thickness of from about 1 mil (25 μm) to about 5 mil (127 μm). Polyimide film is commercially available from a number of sources including Dupont which markets such film under the trade name Kapton™. In addition to having excellent dielectric properties, polyimide films such as Kapton™ have high mechanical properties from cryogenic ranges to 750° F. (400° C.). At −435° F. (−260° C.), the film can be bent around a ¼-in (0.635 cm) mandrel without breaking, and at 932° F. (500° C.), its tensile strength is 4,500 psi (3,100 N/cm$^2$). Importantly, the mechanical strength of polyimide film make it possible to perform manufacturing and assembly processes that would stretch or tear PTFE-based dielectrics. Other materials suitable for use as the planar core member include expanded polytetrafluoroethylene (PTFE) film filled with cyanate ester resin and glass reinforced epoxy film materials, but these would not provide the combined flexibility and mechanical strength properties of polyimide film.

In the preferred embodiment of the present invention, a layer of a first electrically conductive metallic material, designated as layers 14,14', is securely attached, such as by cladding, to the upper and the lower planar surfaces of the core member 12. In the preferred embodiment, the construction of the flexible cable 10 is symmetrically arranged about the core member 12. In the following description, identical layers of the cable 10 will be identified by the same number, with the respective layer on the bottom portion of the cable 10 being identified by a prime mark (') added after the number. In the preferred embodiment, the layers 14,14' are electrodeposited copper foil, or sheet, having a thickness of about 0.0007 in (18 μm). Optionally, the layers 14,14' may have a thickness of up to about 0.0028 in (70 μm).

It is important that each of the layers 14,14' of the first electrically conductive metallic material be in actual physical contact, i.e., that they be contiguous or touching, the respective planar surface of the core member 12 without an intervening layer of adhesive. The high mechanical strength of the core member 12 allows the layers 14,14' to be electrically connected to form a single conductor by conventional via plating techniques. Via plating is a well known technique for electrically connecting circuits or conductors disposed on opposite sides of a circuit board. In an exemplary embodiment, an interconnecting via 16, as shown in FIG. 2, extends through the planar core member 12. The via 16 is formed by plating with an electrically conductive material, for example copper, that physically and electrically joins the two layers 14,14'. PTFE film has a pronounced tendency to stretch during wet processing and does not have the structural integrity of polyimide film of equal thickness. For those reasons, unreinforced PTFE film is undesirable as the base material for thin cables requiring via plating.

A layer of dielectric film 18,18' is superimposed over each of the layers 14,14' of the first electrically conductive material. Suitable dielectric film materials include polytetrafluoroethylene (PTFE), copolymers of polytetrafluoroethylene, ceramic filled polytetrafluoroethylene, and thermoset resin impregnated polytetrafluoroethylene. Preferably, to provide the highest wiring density and the best electrical properties, the dielectric film layers 18,18' are polytetrafluoroethylene film having a thickness of about 1 mil (25 μm). The layers of dielectric film 18,18' are also directly bonded to the underlying layers 14,14' of the first electrically conductive metallic material, in the manner described below, without the use of adhesives. Thus, each of the dielectric film layers 18,18' is contiguous with, i.e., physically touching, a respective one of the layers 14,14' of the first electrically conductive material.

A layer 20,20' of a second electrically conductive metallic material is positioned over each of the dielectric film layers 18,18', as shown in FIGS. 1 and 2. Desirably, the second electrically conductive material is also copper having a thickness of from about 0.0007 in (18 μm) to about 0.0028 in (70 μm). Each of the layers 20,20' of the second electrically material are also bonded, in the manner described below, directly on the respective underlying dielectric film layer 18,18', without the use of adhesives. Although the layers 20,20' of the second electrically conductive metallic material are identified herein as "layers", it should be recognized that the "layer" typically comprises a plurality of separate planarly aligned electrical leads, or conductors, 22,22' arranged in side-by-side relationship as illustrated in FIG. 1. The actual number and pitch, or lateral spacing, of the separate leads 22,22' will depend on particular application requirements, and may comprise a prearranged array of leads 22,22', or alternatively may be formed by removing superfluous conductive from between the leads 22,22', for example by etching. Also, each of the separate leads 22,22' typically has a provision for attachment to a connector or contact, usually at the ends of the cable 10. For such purposes, each of the leads 22,22' may have at least one, and usually two, surface connector contact pads, or bumps, 24 that, as shown in FIG. 2, extend outwardly in a direction away from the core member 12.

A concern of laminated flexible cables constructed with fluoropolymer dielectic film layers heretofore constructed of PTFE, has been that the surface connector contact pads could eventually short to the underlying ground plane if the dielectric layer did not provide sufficient creep resistance to the actuation load of the connector. In the preferred embodiment of the present invention, a portion of the ground plane, i.e., the layers 14,14' of the first electrically conductive material, is removed, as illustrated in FIG. 2, in an area 26 directly beneath the surface connector contact pads 24.

The above described internal arrangement and construction of the flexible cable 10 is typically enclosed within a conventional electrical insulation cover 28, typically formed of an adhesively bonded polyimide, a photosensitive liquid-applied polyimide, or similar protective coating having suitable dielectric properties and high resistance to wear and abrasion.

The flexible cable 10 embodying the present invention is preferably formed by building up the layers of conductors and dielectric film and then bonding the layers together in a single lamination step. This is made possible by the use of a pre-clad core member that has the layers 14,14' of the first electrically conductive material predeposited on the supporting dielectric film.

Advantageously, conductive metal-clad polyimide films are commercially available, for example under the trade name FLEX-I-MID 3000®. More specifically, FLEX-I-MID 3231® has a double clad polyimide film base available in a thickness of either 1 or 2 mil (25 or 50 μm) with electrodeposited copper in a thickness of from 0.0007 to 0.0028 in (18 to 70 μm) intimately bonded, without adhesive, to each side of the polyimide base. Importantly, FLEX-I-MID 3231® has an elastic modulus at room temperature of about 740,000 psi (510,000 N/cm²). The presence of the polyimide film core 12 reinforces the laminated structure so that it can be processed, particularly with respect to the mechanical handling requirements associated with wet processing and the dimensional stability requirements needed to assure good layer-to-layer registration when plating vias, and during other processing steps described below, without the difficulties that would occur with a similarly thick layer of PTFE.

Figure 3:
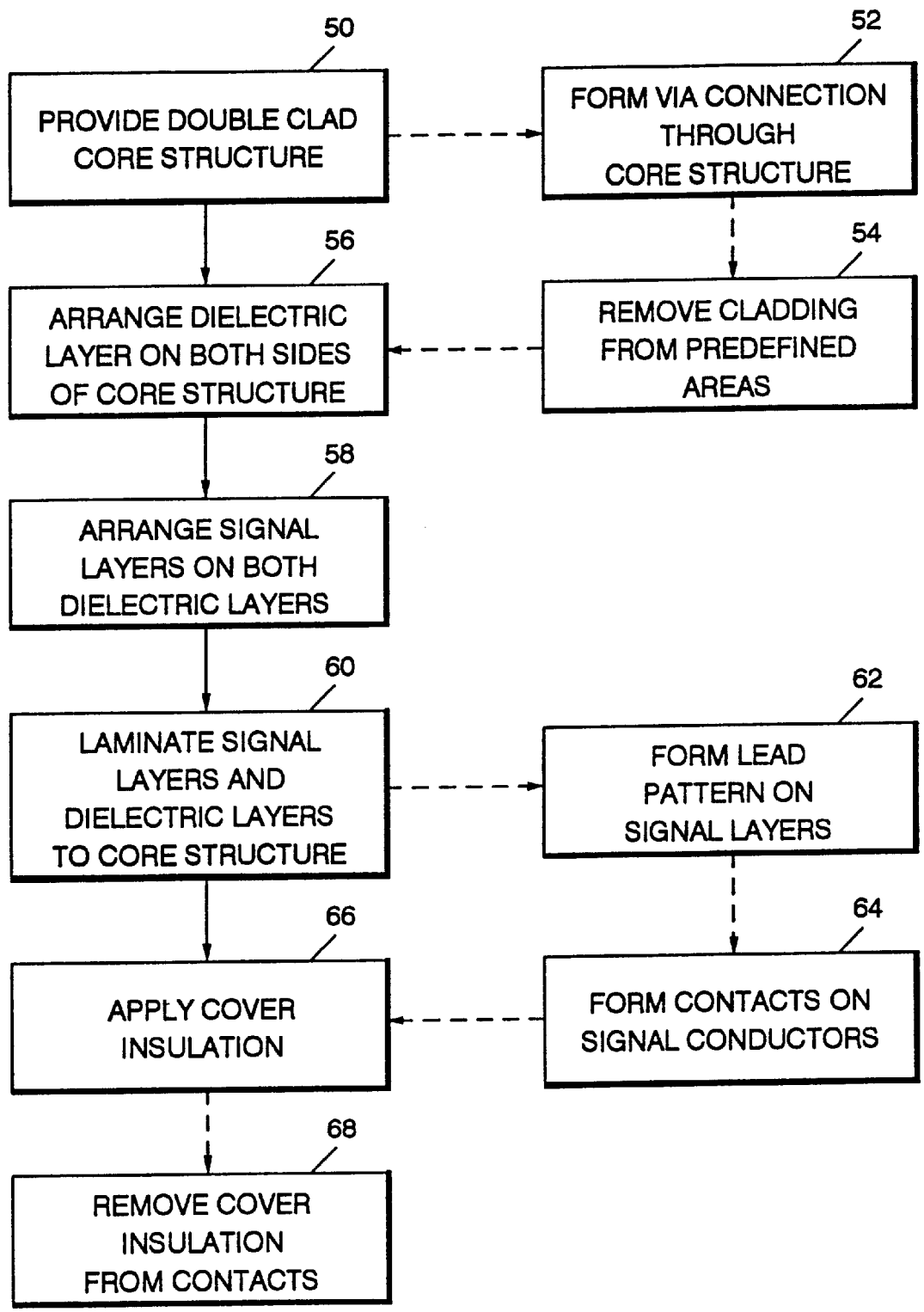
FIG. 3 is a block diagram illustrating the principle steps in the process for manufacturing a flexible cable in accordance with the present invention.

As illustrated schematically by block 50 in FIG. 3, the above described preclad core material is cut to the required width and length to provide a double clad core structure. Desirably, holes are formed through the core member 12 and then plated, as indicated at block 52, to provide the vias 16 that electrically interconnect the layers 14,14' of the first electrically conductive material and thereby form a single composite broad-area ground plane in close, but electrically separated, proximity to each of the signal leads 22,22'.

If clearances 26 are to be provided beneath the surface connector contact pads 24, a predefined portion of the respective clad layer 14,14' is removed, for example by etching, as indicated at box 54 to provide the clearance 26. Thus, it can be seen that dielectric material, i.e., the dielectric film 18,18' and the core member 12, are both positioned directly under the surface contact pads 24, thus avoiding the possibility of eventual shorting of the pads 24 to ground. Also, predesignated areas of the clad layers 14,14' may be removed to permit subsequent front-to-back signal connections between the respective signal layers 20,20'. To ensure secure bonding of the copper layers 14,14' with the overlying PTFE-based dielectric film, it is generally desirable to use a conventional surface treatment process to form a superficial oxide surface on the copper by exposing the copper clad layers to sodium hydroxide or sodium chlorite, prior to covering with the PTFE dielectric film.

As indicated at box 56, the dielectric film layers 18,18' are arranged over the core structure so that the film is in direct contact with the clad layers 14,14' of the core structure. The layers 20,20' of the second electrically conductive material are then arranged over the respective dielectric layers 18,18' as represented at box 58. If preformed electrical leads are used, the layers 20,20' will consist of a prearranged array of the leads 22,22'. To ensure secure bonding of the PTFE-based dielectric film, it is desirable to treat the appropriate surfaces of signal conductor layers 20,20' with a treatment similar to that described above with reference to the ground plane conductors 14,14' prior to lamination.

The above described assembled layers are then laminated, as indicated at box 60, at an elevated temperature in a flat bed press or autoclave, to form a unitary structure. If the layers 20,20' were laminated as planar sheets, the individual leads 22,22' may be conveniently formed after lamination by conventional etching or pattern plating processes, as indicated at block 62, to remove unwanted conductive material or add desired conductive materials to form the individual leads 22,22'. Also, if not formed earlier in association with preformed leads, the surface connector contact pads 24 are conveniently formed, as indicated at box 64, by plating or thermal attachment after lamination of the layered components.

The cover insulation 28 may be arranged as an external layer prior to lamination and bonded with the internal structure in the above single lamination step, or alternatively, as indicated at box 66, be carried out as a separate step subsequent to lamination of the internal structure of the cable 10. In the latter process, the cover 28 may be applied by dipping, coating, adhesive attachment or other conventional process.

Depending on the particular arrangement and construction of the surface connector contact pads 26, it may be necessary, after application of the cover insulation 28, to remove excess insulation 28 that may cover the contact surfaces, as indicated in box 68.

Thus it can be readily seen that the flexible cable 10 embodying the present invention advantageously has a physically strong core member 12 that provides mechanical strength and internal strain relief to the cable 10. Electrical separation of the two signal planes from the ground plane is provided by a dielectric film that advantageously may be selected solely for its electrical properties. This arrangement allows the cable 10 to be constructed with both high strength properties and low dielectric properties without compromising one for the other. Importantly, adhesive materials are not used in formation of the laminated internal structure of the cable.

Although the present invention is described in terms of a preferred exemplary embodiment, those skilled in the art will recognize that changes in core, conductor, and dielectric materials may be made, consistent with the specifically stated required material properties, without departing from the spirit of the invention. Likewise, connector contacts may have a different construction and arrangement than that illustrated and described herein. Such changes are intended to fall within the scope of the following claims. Other aspects, features and advantages of the present invention can be obtained from a study of this disclosure and drawings, along with the appended claims.

What is claimed is:

1. A method for manufacturing a flexible cable suitable for conducting electrical signals, comprising:

providing a core structure having a planar dielectric member with a pair of opposed planar surfaces, said planar dielectric member having secured thereto a layer of a first electrically conductive material on each of said opposed planar surfaces;

arranging a layer of dielectric film on each layer of the first electrically conductive material of the core structure;

arranging a layer of a second electrically conductive material on each layer of the dielectric film, the dielectric film electrically insulating the second electrically conductive material from the first electrically conductive material;

laminating said layers of said first and second electrically conductive material, said layers of dielectric film and said core structure and forming a unitary laminated structure comprising said core structure, said layers of dielectric film and said layers of the first and second electrically conductive material; and forming a plurality of separately defined electrical leads in each layer of the second electrically conductive material and forming a surface connector contact element on at least one of the defined electrical leads.

2. A method for manufacturing a flexible cable suitable for conducting electrical signals, as set forth in claim 1, wherein said method includes electrically connecting the layers of the first electrically conductive material disposed on the opposed planar surfaces of the planar dielectric member.

3. A method for manufacturing a flexible cable suitable for conducting electrical signals, as set forth in claim 1, wherein the step of arranging a layer of a second electrically conductive material on each layer of the dielectric film includes arranging a plurality of spaced apart electrical leads formed of said second electrically conductive material in a coplanar relationship on said dielectric film.

4. A method for manufacturing a flexible cable suitable for conducting electrical signals, as set forth in claim 1, wherein said method includes forming a plurality of spaced apart electrical leads in each layer of the second electrically conductive material subsequent to laminating the layers and forming a laminated structure.

5. A method for manufacturing a flexible cable suitable for conducting electrical signals, as set forth in claim 1, wherein said method includes removing a portion of at least one of the layers of the first electrically conductive material in a predefined area between said electrical element and said planar dielectric member.

6. A method for manufacturing a flexible cable suitable for conducting electrical signals, as set forth in claim 1, wherein said method includes applying an electrical insulation covering over said laminated structure.

* * * * *